United States Patent
Sato

(10) Patent No.: US 8,835,331 B2
(45) Date of Patent: Sep. 16, 2014

(54) VAPOR-PHASE GROWING APPARATUS AND VAPOR-PHASE GROWING METHOD

(75) Inventor: Yuusuke Sato, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 20 days.

(21) Appl. No.: 13/220,273

(22) Filed: Aug. 29, 2011

(65) Prior Publication Data

US 2012/0231610 A1   Sep. 13, 2012

(30) Foreign Application Priority Data

Mar. 9, 2011 (JP) .................. P2011-051550

(51) Int. Cl.

| | |
|---|---|
| *H01L 21/31* | (2006.01) |
| *H01L 21/469* | (2006.01) |
| *H01L 21/20* | (2006.01) |
| *H01L 21/36* | (2006.01) |
| *H01L 21/44* | (2006.01) |
| *C23C 16/30* | (2006.01) |
| *C23C 16/455* | (2006.01) |
| *H01L 21/02* | (2006.01) |

(52) U.S. Cl.
CPC ..... *C23C 16/45565* (2013.01); *H01L 21/02573* (2013.01); *C23C 16/303* (2013.01); *H01L 21/02458* (2013.01); *H01L 21/0254* (2013.01); *H01L 21/0262* (2013.01)
USPC ....... 438/765; 438/478; 438/680; 257/E21.09

(58) Field of Classification Search
USPC .......................... 438/478, 680, 681, 765–777
See application file for complete search history.

(56) References Cited

U.S. PATENT DOCUMENTS

| | | | |
|---|---|---|---|
| 6,645,884 B1 * | 11/2003 | Yang et al. | ...................... 438/791 |
| 2002/0026892 A1 | 3/2002 | Aoyagi et al. | |
| 2007/0251642 A1 * | 11/2007 | Bera et al. | ................ 156/345.26 |
| 2012/0077335 A1 * | 3/2012 | Sanchez et al. | ............... 438/478 |

FOREIGN PATENT DOCUMENTS

| | | |
|---|---|---|
| JP | 4-337627 | 11/1992 |
| JP | 2804959 | 7/1998 |
| JP | 2002-16008 | 1/2002 |
| JP | 2002-75879 | 3/2002 |
| JP | 2009-302507 | 12/2009 |

OTHER PUBLICATIONS

Office Action issued by the Japanese Patent Office on Nov. 20, 2012, for Japanese Patent Application No. 2011-051550, and English-language translation thereof.
Decision Refusal issued by the Japanese Patent Office on Apr. 16, 2013, for Japanese Patent Application No. 2011-051550.

* cited by examiner

*Primary Examiner* — Calvin Choi
(74) *Attorney, Agent, or Firm* — Finnegan, Henderson, Farabow, Garrett & Dunner, L.L.P.

(57) ABSTRACT

According to one embodiment, a vapor-phase growing apparatus, includes: a reactor containing a plurality of gas introduction portions and a gas reaction portion located below the gas introduction portions; a susceptor, of which a surface is exposed in an interior space of the gas reaction portion of the reactor, for disposing and fixing a substrate on the surface thereof; a gas distributor provided between the gas introduction portions and the gas reaction portion of the reactor; a plurality of gas inlet conduits which are connected with the gas introduction portions, respectively; and a switching device, which is provided in an outside of the reactor, for switching gases to be supplied to the gas inlet conduits, respectively.

7 Claims, 3 Drawing Sheets

FIG. 3
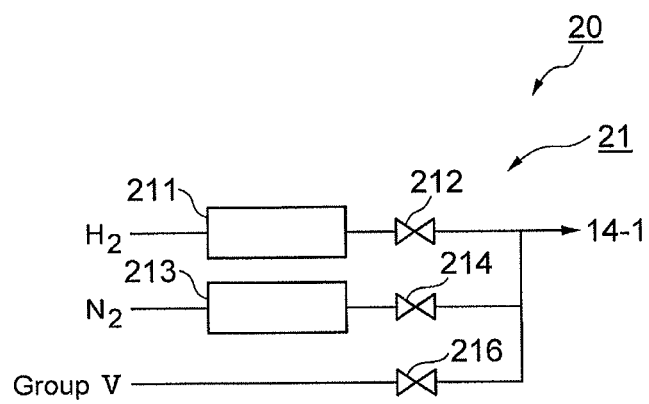
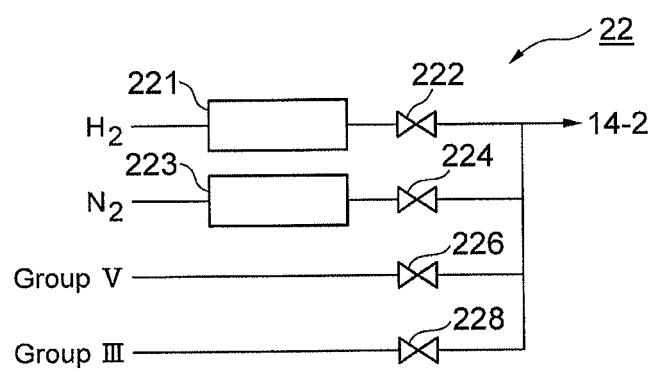
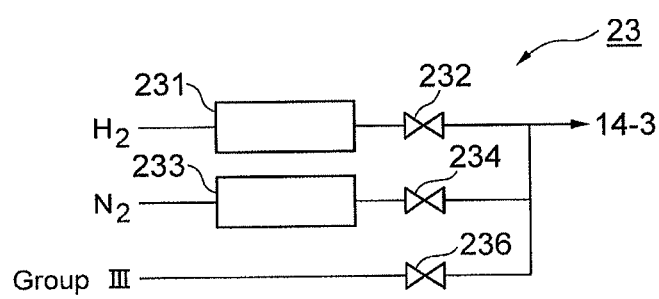

VAPOR-PHASE GROWING APPARATUS AND VAPOR-PHASE GROWING METHOD

CROSS-REFERENCE TO RELATED APPLICATION

This application is based upon and claims the benefit of priority from Japanese Patent Application No. 2011-051550 filed on Mar. 9, 2011, the entire contents of which are incorporated herein by reference.

FIELD

Embodiments described herein relate generally to a vapor-phase growing apparatus and a vapor-phase growing method.

BACKGROUND

Metal Organic Chemical Vapor Deposition (MOCVD) is a one of typical vapor-phase growing methods and according to the MOCVD, a group-III metal organic (MO) precursor is gasified and supplied with a carrier gas and a group V gas onto a substrate so that the group-III MO precursor is thermally reacted with the group-V gas on the surface of the substrate to form a film thereon. Since the MOCVD can control the thickness and composition of the film and have excellent productivity, the MOCVD can be widely available as a film-forming technique in the manufacture of semiconductor devices.

An MOCVD apparatus to be employed in the MOCVD includes a reactor, a susceptor disposed in the reactor and gas conduits for flowing reaction gases onto the surface of a substrate disposed on the susceptor. In the MOCVD apparatus, the substrate is disposed on the susceptor and heated at a prescribed temperature while raw material gases such as MO gas and a carrier gas such as nitrogen gas are introduced onto the surface of the substrate through the respective gas conduits so as to conduct the intended thin film-forming process.

In the case that the raw material gases and the like are supplied to the surface of the substrate, group-III gas and group-V gas are introduced into the reactor through a gas distributor disposed opposite to the substrate.

On the other hand, in the case that a plurality of films are stacked by the MOCVD to form a predetermined device, the films are subsequently formed by using the same MOCVD apparatus. Since the compositions of the films are different from one another, however, it may be required that one or more of the raw material gases to be introduced into the reactor through the respective gas conduits are varied remarkably in kind and flow rate per film.

In a proximal gas distribution reactor where a substrate is disposed in the vicinity of a gas distributor or a high velocity rotation reactor where a substrate is disposed away from a gas distributor and rotated at a rotation speed within a range of several hundreds rpm to several thousands rpm, it is required that gases are uniformly supplied through the gas distributor in order to realize the uniformity of a film to be formed on the substrate. With regard to a gas distributor with many holes, the ununiformity of the flow of the gas may occur in the vicinity of the gas distributor due to the blowoff of the gas through the holes of the gas distrubutor, but it is required that the flow of the gas is rendered almost uniform until the gas is flowed to the boundary layer in the vicinity of the substrate.

In order to flow a gas through a gas distributor with a given size uniformly, it is required that an appropriate pressure loss is caused when the gas is passed through the gas distributor and the ununiformity of the gas flow through the gas distributor is not caused due to the gas flow in the upstream of the gas distributor. However, if the kind and flow rate of a raw material gas through the gas distributor are largely changed and for example, the flow rate of the raw material gas becomes low so that the pressure loss of the raw material gas becomes too small when the raw material gas is passed through the gas distributor, the distribution of the flow rate of the raw material gas within the gas distributor becomes large. In contrast, if the flow rate of the raw material gas becomes high, the raw material gas is supplied to the substrate before the flow of the raw material gas through the gas distributor is rendered uniform, causing the ununiformity of a film to be formed on the substrate. Moreover, the ununiformity of the gas flow within the gas distributor and the jet flow of the raw material gas through the gas distributor cause some vortexes in the reactor, resulting in the production of particles in the vicinity of the gas distributor and the production of depositions on the gas distributor.

In this case, the depositions are adhered with the film after or under formation, deteriorating the quality of the film.

BRIEF DESCRIPTION OF THE DRAWINGS

FIG. 3 is a schematic view showing a switching device relating to the vapor-phase growing apparatus shown in FIG. 1.

DETAILED DESCRIPTION

According to one embodiment, a vapor-phase growing apparatus, includes: a reactor containing a plurality of gas introduction portions and a gas reaction portion located below the gas introduction portions; a susceptor, of which a surface is exposed in an interior space of the gas reaction portion of the reactor, for disposing and fixing a substrate on the surface thereof; a gas distributor provided between the gas introduction portions and the gas reaction portion of the reactor; a plurality of gas inlet conduits which are connected with the gas introduction portions, respectively; and a switching device, which is provided in an outside of the reactor, for switching gases to be supplied to the gas inlet conduits, respectively.

Figure 1:
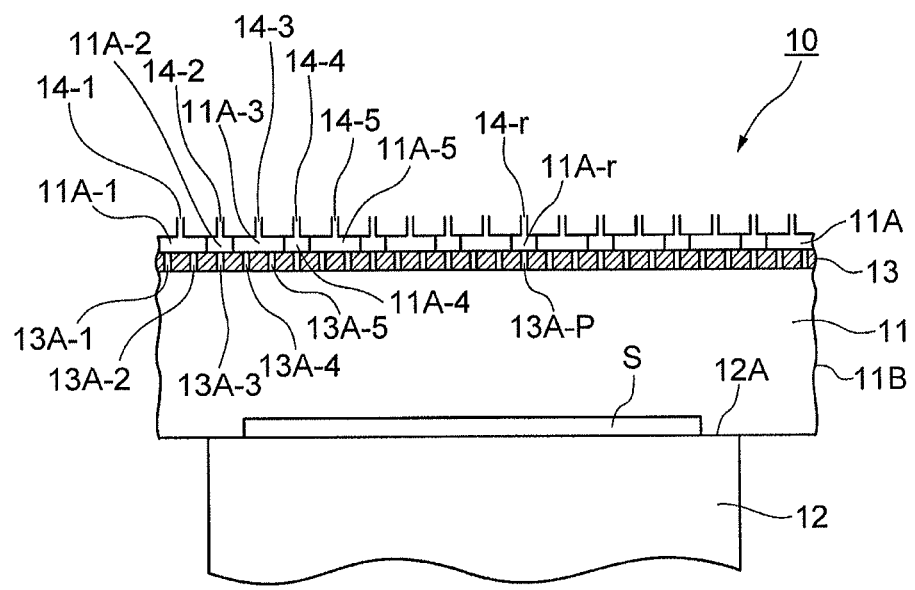
FIG. 1 is a cross sectional view schematically showing the structure of a vapor-phase growing apparatus according to an embodiment.
Figure 2:
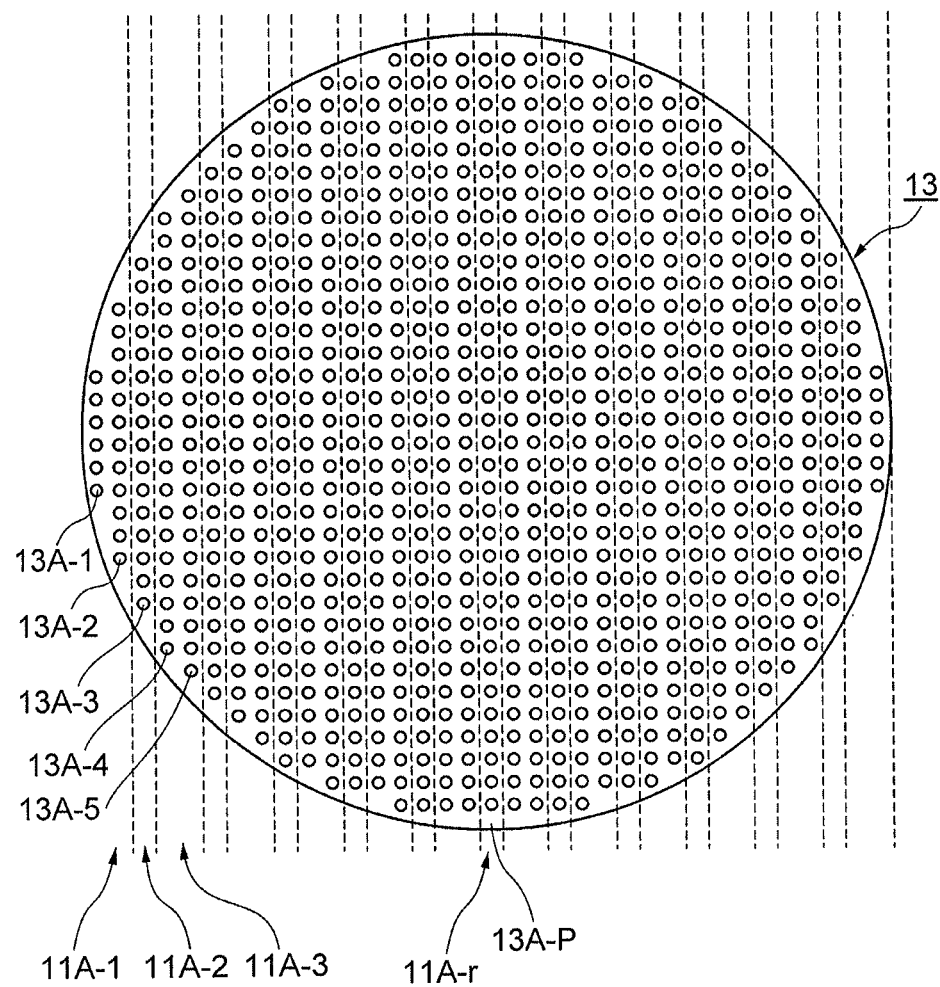
FIG. 2 is an enlarged view of a gas distributor in the vapor-phase growing apparatus shown in FIG. 1.

FIG. 1 is a cross sectional view schematically showing the structure of a vapor-phase growing apparatus according to this embodiment and FIG. 2 is an enlarged view of a gas distributor in the vapor-phase growing apparatus shown in FIG. 1. FIG. 3 is a schematic view showing a switching device relating to the vapor-phase growing apparatus shown in FIG. 1.

As shown in FIG. 1, a vapor-phase growing apparatus 10 in this embodiment includes a reactor 11 containing a plurality of gas introduction portions 11A and a gas reaction portion 11B located below the gas introduction portions 11A and a susceptor 12 of which the surface is exposed to the interior space of the gas reactive portion 11B. Then, the gas introduction portions 11A are designated by reference numerals "11A-1", "11A-2", "11A-3", "11A-4", "11A-5", . . . "11A-r". . . .

The susceptor 12 is heated by a not shown heater so as to heat the substrate S to a predetermined temperature. The gas reaction portion 11B is configured such that the substrate S is disposed and raw material gases and a carrier gas are introduced onto the surface of the substrate S, and thus functions as a film-forming chamber.

As shown in FIG. 1, moreover, a gas distributor 13 is provided between the gas introduction portions 11A and the gas reaction portion 11B of the reactor 11. A plurality of gas supplying holes are formed at the gas distributor 13 and designated by reference numerals "13A-1", "13A-2", "13A-3", "13A-4", "13A-5" . . . "13A-p" . . . .

As shown in FIG. 1, furthermore, a plurality of gas inlet conduits 14-1, 14-2, 14-3, 14-4, 14-5, . . . 14-r . . . are connected with the corresponding gas introduction portions 11A, respectively. In this case, each of the gas inlet conduits corresponds to each of the gas introduction portions. For example, the gas inlet conduit 14-1 is connected with the gas introduction portion 11A-1, and the gas inlet conduit 14-2 is connected with the gas introduction portion 11A-2.

As shown in FIG. 2, in addition, the gas inlet conduits 11A-1 and the like are arranged in parallel with the direction of arrangement of the gas inlet conduits 13A-1 and the like. This arrangement enhances the uniformity of the supply of raw material gases to the substrate S by controlling the flow velocities and flow rates of the raw material gases as will be described, and thus enhances the uniformity of a film to be formed and the reproducibility.

In the vapor-phase growing apparatus 10 in this embodiment, a switching device 20 for switching the gases to be supplied to the gas inlet conduits 14-1 and the like is provided in the outside of the reactor 11. Inherently, the switching device 20 should have switching elements corresponding to the number (r) of the gas inlet conduits, but in this embodiment, only the switching elements to be connected with the gas inlet conduits 14-1, 14-2 and 14-3 are shown in order to clarify the features of the vapor-phase growing apparatus 10 and the vapor-phase growing method as will be described hereinafter.

The first switching element 21 is an element for switching the gases to be supplied to the first gas inlet conduit 14-1, and thus connected with the first gas inlet conduit 14-1. In this embodiment, the first switching element 21 has mass flow controllers 211 and 213 which control the flow rates of hydrogen gas and nitrogen gas as carrier gases accompanied with a group-V gas, respectively, and valves 212 and 214 provided between the mass flow controllers 211, 213 and the first gas inlet conduit 14-1. Moreover, the first switching element 21 has a valve 216 for a raw material gas such as a group-V gas which is supplied from another raw material source under the control of flow rate.

The second switching element 22 is an element for switching the gases to be supplied to the second gas inlet conduit 14-2, and thus connected with the second gas inlet conduit 14-2. In this embodiment, the second switching element 22 has mass flow controllers 221 and 223 which control the flow rates of hydrogen gas and nitrogen gas as carrier gases accompanied with a group-V gas or a group-III gas, respectively, and valves 222 and 224 provided between the mass flow controllers 221, 223 and the second gas inlet conduit 14-2. Moreover, the second switching element 22 has valves 226 and 228 for the group-III gas and the group-V gas as raw material gases which are supplied from other raw material sources under the control of flow rate.

The third switching element 23 is an element for switching the gases to be supplied to the third gas inlet conduit 14-3, and thus connected with the third gas inlet conduit 14-3. In this embodiment, the third switching element 23 has mass flow controllers 231 and 233 which control the flow rates of hydrogen gas and nitrogen gas as carrier gases accompanied with a group-III gas, respectively, and valves 232 and 234 provided between the mass flow controllers 231, 233 and the third gas inlet conduit 16. Moreover, the third switching element 23 has a valve 236 for a raw material gas such as a group-III gas which is supplied from another raw material source under the control of flow rate.

Then, the vapor-phase growing method using the vapor-phase growing apparatus will be described. For clarifying the features of the vapor-phase growing apparatus 10 and the vapor-phase growing method as will be described below, in this embodiment, trimethyl gallium (TMG, $Ga(CH_3)_3$) is employed as a group-III gas and ammonia ($NH_3$) gas is employed as a group-V gas to form a GaN film on the substrate S. In this embodiment, moreover, the flow rate of the $NH_3$ gas is mainly changed remarkably for the aforementioned purpose.

In the case that a blue light emitting element is formed on a sapphire substrate, for example, it is required that some GaN layers such as a low temperature buffer GaN layer, a high temperature GaN layer, a Si-doped GaN layer, a barrier GaN layer for an active layer and a Mg-doped GaN layer are formed. In this case, the appropriate flow rate of the $NH_3$ gas may be different per GaN film.

First of all, the $NH_3$ gas as the raw material gas is supplied to the first gas inlet portion 11A-1 of the reactor 11 from the first switching element 21 of the switching device 20 connected with the first gas inlet conduits 14-1 while nitrogen gas as a carrier gas is supplied to the second gas inlet conduit 11A-2 of the reactor 11 from the second switching element 22 of the switching device 20 connected with the second gas inlet conduit 14-2. Moreover, the TMG and hydrogen gas as a carrier gas accompanied with the TMG are supplied to the third gas inlet conduit 11A-3 of the reactor 11 from the third switching element 23 of the switching device 20 connected with the third gas inlet conduit 14-3.

In this case, the $NH_3$ gas is supplied at a prescribed flow rate to the first gas introduction portion 11A-1 of the reactor 11 from the first switching element 21 and the first gas introduction conduit 14-1 while the nitrogen gas is supplied at a prescribed flow rate to the second gas introduction portion 11A-2 of the reactor 11 from the second switching element 22 and the second gas conduit 14-2. Moreover, the TMG and the corresponding carrier gas are supplied at prescribed flow rates to the third gas introduction portion 11A-3 from the third switching element 23 and the third gas inlet conduit 14-3.

The $NH_3$ gas supplied to the first gas introduction portion 11A-1 is introduced into the gas reaction portion 11B of the reactor 11 through the first gas supplying holes 13A-1 and the second gas supplying holes 13A-2 of the gas distributor 13 and supplied onto the substrate S. The nitrogen gas supplied to the second gas inlet portion 11A-2 is introduced into the gas reaction portion 11B of the reactor 11 through the third gas supplying holes 13A-3 of the gas distributor 13 and supplied onto the substrate S. The TMG and the hydrogen gas supplied to the third gas inlet portion 11A-3 are introduced into the gas reaction portion 11B of the reactor 11 through the fourth gas supplying holes 13A-4 and the fifth gas supplying holes 13A-5 of the gas distributor 13 and supplied onto the substrate S. Thereby, the intended GaN film is formed in a predetermined thickness on the substrate S.

Then, the group-V gas and the group-III gas are supplied so that the carrier gas is flowed between the flow of the group-V gas and the flow of the group-III gas as the combination of $NH_3$ gas/nitrogen gas/TMG, hydrogen gas/nitrogen gas/$NH_3$ gas/nitrogen gas/TMG or the like.

The nitrogen gas, the $NH_3$ gas, the TMG gas/hydrogen gas which are to be introduced into the reactor 11 are set to the respective predetermined flow velocities so that the flows of those gases are not disturbed and thus those gases are flowed uniformly through the gas distributor and so that the jet flow, originated from that the flow velocities of one or more of those gases become high, does not negatively affect the film-forming process when those gases are introduced into the reactor 11.

Supposed that the flow rate of the $NH_3$ gas to be introduced into the reactor 11 is set more than that in the embodiment as described above. For example, if the flow rate of the $NH_3$ gas is set twice as high as that in the embodiment as described above, the flow velocity of the $NH_3$ gas is required to be set twice as high as that in the embodiment via the first switching element 21 and the first gas inlet conduit 14-1.

In this case, the $NH_3$ gas is rendered a jet flow through the gas distributor 13 so that the raw material gases of the $NH_3$ gas and the TMG are not uniformly supplied over the substrate S, resulting in the ununiformity of the intended GaN film and the deterioration in reproducibility of the GaN film. Moreover, the vortex of the raw material gases is produced so that the raw material gases are reacted with one another in the vapor-phase. Therefore, the thus obtained product is adhered with the gas distributor 13 so as to form the depositions thereon.

Therefore, the flow rate of the $NH_3$ gas is set twice as high as described above, the $NH_3$ gas is also introduced into the gas introduction portion 11A of the reactor 11 from the second gas inlet conduit 14-2 by closing the valve 224 and opening the valve 226 of the second switching element 22 of the switching device 20 which is connected with the second gas inlet conduit 14-2 instead that the flow velocity of the $NH_3$ gas is set twice as high as described above.

In this case, the $NH_3$ gas is introduced into the gas reaction portion 11B of the reactor 11 from the third gas supplying holes 13A-3 of the gas distributor 13 in addition to the first gas supplying holes 13A-1 and the second gas supplying holes 13A-2. Here, the group-V gas and the group-III gas are supplied alternately through other gas supplying holes of the gas distributor 13 as the combination of $NH_3$ gas/$NH_3$ gas/TMG, hydrogen gas/$NH_3$ gas/$NH_3$ gas/$NH_3$ gas/TMG or the like.

Therefore, even though the flow rate of the $NH_3$ gas is set twice as high, the $NH_3$ gas can be introduced into the gas reaction portion 11B of the reactor 11 through the gas supplying holes of the gas distributor 13 at the almost same flow velocity. Therefore, the $NH_3$ gas is not rendered a jet flow through the gas distributor so that the raw material gases of the $NH_3$ gas and the TMG can be supplied over the substrate S.

As a result, the uniformity and reproducibility of the thus obtained GaN film are not deteriorated so that the disadvantage of the deterioration in uniformity and reproducibility of the GaN film can be suppressed. Moreover, the depositions on the gas distributor 13 is reduced and thus not adhered with the GaN film so as not to deteriorate the properties of the GaN film.

In the above case, the flow rate of the $NH_3$ gas is set twice as high, but may be set to any times as high only if the kind and flow rate of gas to be supplied are selected and set so as to reduce the disturbance of the gas through the gas distributor.

In the case of the formation of the GaN film on the substrate S, the mixed gas of the nitrogen gas and the hydrogen gas may be employed as the carrier gas. Moreover, the $NH_3$ gas is accompanied with the carrier gas.

The number of switching element of the switching device 20 may be set to four or more. The switching device 20 may be connected with the gas inlet conduits via a manifold.

In the aforementioned embodiment, the TMG is employed as the group-III gas and the $NH_3$ gas is employed as the group-V gas. As the group-III gas can be exemplified trimethyl indium (TMI, $In(CH_3)_3$) and trimethyl aluminum (TMA, $Al(CH_3)_3$) in addition to the TMG. As the group-V gas can be exemplified tert-butyl amine (t-$C_4H_9NH_2$), monomethyl hydrazine ($N_2H_3$ ($CH_3$)), arsine ($AsH_3$) phosphine ($PH_3$) in addition to the $NH_3$. Then, as an n-type dopant can be used silane ($SiH_4$) and as a p-type dopant can be used dicyclopentadienyl magnesium (($C_5H_5)_2Mg$) can be used.

In the case of the growth of an InGaN layer, TMG and TMI are employed as the group-III gas. In the case of the growth of an AlGaN layer, TMG and TMA are employed. In the case of the growth of a GaAs layer, $AsH_3$ is employed as the group-V gas.

In addition to the aforementioned group-III gas and group-V gas, group-II gas such as dimethyl zinc ($Zn(CH_3)_2$), group-IV gas such as methane ($CH_4$) and group-VI gas such as hydrogen selenide ($H_2Se$) may be employed.

In the growth of a ZnSe layer, $Zn(CH_3)_2$ and $H_2Se$ are employed. In the growth of a carbon film, $CH_4$ is employed.

In addition to the nitrogen gas and the hydrogen gas, argon gas may be employed as the subflow gas.

In the aforementioned embodiment, the flow rate of the $NH_3$ gas is changed to form the same GaN film, but may be changed to form a film with a different composition such as an InGaN film.

In this embodiment, the gas introduction portion 11A-1 and the like are arranged in parallel with the gas supplying holes 13A-1 and the like of the gas distributor 13, but may be arranged concentrically on the gas distributor 13.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A vapor-phase growing apparatus, comprising:
   a reactor containing a plurality of gas introduction portions and a gas reaction portion located below the gas introduction portions;
   a susceptor, of which a surface is exposed in an interior space of the gas reaction portion of the reactor, for disposing and fixing a substrate on the surface thereof;
   a gas distributor provided between the gas introduction portions and the gas reaction portion of the reactor;
   a plurality of gas inlet conduits which are connected with the gas introduction portions, respectively, the plurality of gas inlet conduits being disposed separately from each other; and
   a switching device, which is provided in an outside of the reactor, including a plurality of valves disposed upstream of each of the gas inlet conduits, each one of the plurality of valves being connected between a source of gas and a corresponding one of the gas inlet conduits to switch on or off the gas to be supplied to the corresponding gas inlet conduit, so that a number of the valves in an open state is controlled according to a volume of flow of the gas.

2. The apparatus as set forth in claim 1,
   wherein the gas introduction portions are arranged in parallel with a direction of arrangement of gas supplying holes of the gas distributor.

3. The apparatus as set forth in claim 1,
wherein the carrier gas is at least one selected from the group consisting of nitrogen gas, hydrogen gas and argon gas.

4. A vapor-phase growing method, comprising:
disposing and fixing a substrate on a susceptor, in a reactor containing a plurality of gas introduction portions, a gas reaction portion located below the gas introduction portions, and a plurality of gas inlet conduits connected with corresponding gas introduction portions, a surface of the susceptor being exposed in an interior space of the gas reaction portion of the reactor, and the plurality of gas inlet conduits being disposed separately from each other;
supplying a gas at a first flow rate onto the substrate in the gas reaction portion from a first number of the gas inlet conduits to form a first film on the substrate; and
supplying the gas at a second flow rate onto the substrate in the gas reaction portion from a second number of the gas inlet conduits to form a second film on the substrate.

5. The method as set forth in claim 4,
wherein the gas introduction portions are arranged in parallel with a direction of arrangement of gas supplying holes of the gas distributor.

6. The method as set forth in claim 4,
wherein the carrier gas is at least one selected from the group consisting of nitrogen gas, hydrogen gas and argon gas.

7. The vapor-phase growing apparatus as set forth in claim 1,
wherein the gas introduction portions include a first gas introduction portion and a second gas introduction portion,
the gas distributor has a first gas supplying hole connecting the first gas introduction portion and the gas reaction portion, and a second gas supplying hole connecting the second gas introduction portion and the gas reaction portion,
the gas inlet conduits include a first gas inlet conduit connected with the first gas introduction portion, and a second inlet conduit connected with the second gas introduction portion, and
the switching device switches gases including an $NH_3$ raw material gas and a carrier gas to be supplied so that a first state and a second state is changed, in the first state, the $NH_3$ raw material gas is supplied to the first gas net conduit and the career gas is supplied to the second gas inlet conduit, and in the second state, the career gas is supplied to the first gas net conduit and the $NH_3$ raw material gas is supplied to the second gas net conduit.

* * * * *

UNITED STATES PATENT AND TRADEMARK OFFICE
CERTIFICATE OF CORRECTION

| | |
|---|---|
| PATENT NO. | : 8,835,331 B2 |
| APPLICATION NO. | : 13/220273 |
| DATED | : September 16, 2014 |
| INVENTOR(S) | : Sato |

Page 1 of 1

It is certified that error appears in the above-identified patent and that said Letters Patent is hereby corrected as shown below:

In the Claims

Claim 7, column 8, lines 21-22, change "first gas net conduit" to --first gas inlet conduit--.

Claim 7, column 8, line 24, change "first gas net conduit" to --first gas inlet conduit--.

Claim 7, column 8, line 25, change "second gas net conduit" to --second gas inlet conduit--.

Signed and Sealed this
Third Day of March, 2015

Michelle K. Lee
*Deputy Director of the United States Patent and Trademark Office*